(12) United States Patent
Nijaguna et al.

(10) Patent No.: US 11,049,991 B2
(45) Date of Patent: Jun. 29, 2021

(54) MANUFACTURING METHOD OF AN OPTICAL MODULE

(71) Applicant: Lite-On Singapore Pte. Ltd., Singapore (SG)

(72) Inventors: Suresh Basoor Nijaguna, Singapore (SG); Guo-Jun Xu, Singapore (SG); Kun-Lung Lee, New Taipei (TW); Sin-Heng Lim, Singapore (SG); Teck-Chai Goh, Singapore (SG); Yu-Chou Lin, New Taipei (TW)

(73) Assignee: LITE-ON SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 16/564,211

(22) Filed: Sep. 9, 2019

(65) Prior Publication Data

US 2021/0074874 A1    Mar. 11, 2021

(51) Int. Cl.
*H01L 31/12* (2006.01)
*H01L 33/52* (2010.01)
*H01L 33/58* (2010.01)
*H01L 31/0203* (2014.01)
*H01L 33/44* (2010.01)
*H01L 31/18* (2006.01)
*H01L 31/0216* (2014.01)

(52) U.S. Cl.
CPC .......... *H01L 31/12* (2013.01); *H01L 31/0203* (2013.01); *H01L 31/02164* (2013.01); *H01L 31/18* (2013.01); *H01L 33/44* (2013.01); *H01L 33/52* (2013.01); *H01L 33/58* (2013.01); *H01L 2933/005* (2013.01); *H01L 2933/0025* (2013.01)

(58) Field of Classification Search
CPC ................. H01L 31/12; H01L 31/0203; H01L 31/02164; H01L 31/18; H01L 33/44; H01L 33/52; H01L 33/58
See application file for complete search history.

(56) References Cited

U.S. PATENT DOCUMENTS 10,566,467 B2 *  2/2020  Yu ........................ H01L 31/0232
10,734,540 B1 *  8/2020  Chen .................. H01L 31/02164
2005/0249943 A1 * 11/2005  Nishikawa ............. B01J 35/004
                                                         428/337

(Continued)

*Primary Examiner* — Christine A Enad
(74) *Attorney, Agent, or Firm* — Li & Cai Intellectual Property (USA) Office (57) ABSTRACT

A manufacturing method of an optical module is provided and includes: attaching a light emitting diode light emitting device and a sensor on a substrate; disposing a first encapsulation portion on the light emitting device and the substrate; disposing a second encapsulation portion on the sensor and the substrate; disposing a shielding layer on the first encapsulation portion, the second encapsulation portion and the substrate; removing a first portion of the first encapsulation portion, a second portion of the second encapsulation portion, and a third portion of the shielding layer, and the first portion corresponds to a position of the light emitting device, the second portion corresponds to a position of the sensor, and the third portion corresponds to the positions of the light emitting device and the sensor; and forming a third encapsulation layer on the shielding layer, the first encapsulation portion and the second encapsulation portion.

10 Claims, 10 Drawing Sheets

(56) References Cited

U.S. PATENT DOCUMENTS

| | | | |
|---|---|---|---|
| 2010/0181578 A1* | 7/2010 | Li | H01L 31/0203 |
| | | | 257/82 |
| 2012/0290255 A1* | 11/2012 | Kelkar | H01L 25/167 |
| | | | 702/150 |
| 2015/0028390 A1* | 1/2015 | Colino | H01L 29/402 |
| | | | 257/194 |
| 2015/0114815 A1* | 4/2015 | Chang | H03K 17/9622 |
| | | | 200/5 R |
| 2019/0070577 A1* | 3/2019 | Taguchi | H01L 25/167 |
| 2019/0207051 A1* | 7/2019 | Utsumi | H01L 31/0203 |

\* cited by examiner

MANUFACTURING METHOD OF AN OPTICAL MODULE

FIELD OF THE DISCLOSURE

The present disclosure relates to a manufacturing method of an optical module, and more particularly to a manufacturing method of an optical module to achieve miniaturization of electronic device.

BACKGROUND OF THE DISCLOSURE

Figure 1:
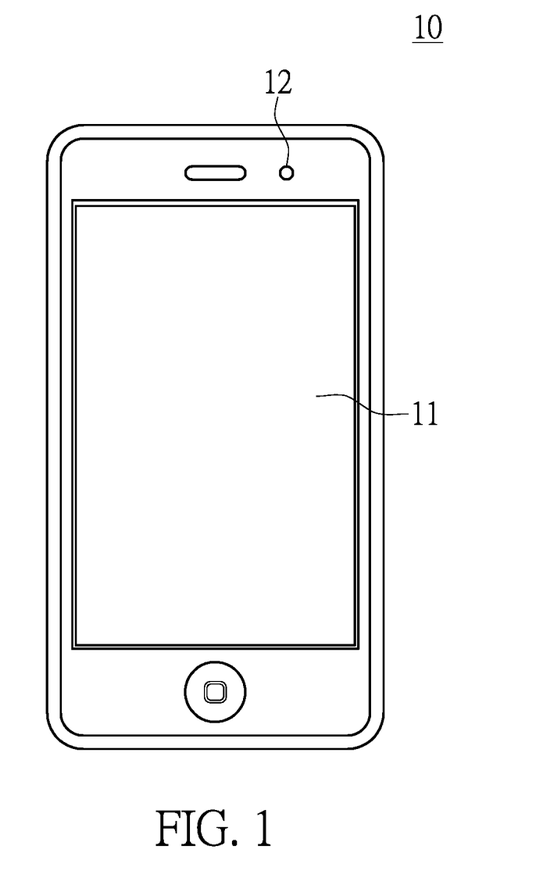
FIG. 1 is a schematic view of a conventional mobile phone.

Currently, the minimization of the size of the ambient sensor and the proximity sensor is always a trend in mobile phone market because of wider phone screen or larger space for other electrical components. FIG. 1 is a schematic view of a conventional mobile phone. With reference to FIG. 1, in a mobile phone 10, when the size of a display 11 of the mobile phone 10 is become larger and the size of an optical module with the ambient sensor and the proximity sensor is getting smaller, a problem of crosstalk phenomenon has become a significant issue in the development of the mobile phone 10.

Therefore, a need has arisen to design a novel manufacturing method to lower the effect of the crosstalk phenomenon when the size of the optical module with the proximity sensor is become smaller and smaller.

SUMMARY OF THE DISCLOSURE

In response to the above-referenced technical inadequacies, the present disclosure provides a manufacturing method of an optical module to improve a crosstalk phenomenon in the proximity sensor.

In order to solve the aforementioned problem, the present disclosure provides a manufacturing method of an optical module and the method includes: attaching a light emitting diode and a sensor on a substrate; disposing a first encapsulation portion on the light emitting diode and the substrate; disposing a second encapsulation portion on the sensor and the substrate; disposing a shielding layer on the first encapsulation portion, the second encapsulation portion and the substrate; removing a first portion of the first encapsulation portion, a second portion of the second encapsulation portion, and a third portion of the shielding layer, wherein the first portion correspond to a position of the light emitting diode, the second portion corresponds to a position of the sensor, and the third portion correspond to the positions of the light emitting diode and the sensor; and forming a third encapsulation layer on the shielding layer, the first encapsulation portion and the second encapsulation portion.

Another one of the embodiments of the present disclosure further includes a step: coating an ultraviolet block layer on the first encapsulation portion, the second encapsulation portion and the substrate.

Since the optical module in the present disclosure is able to block most of the scattered light via the shielding layer as sub-micro thickness, the optical module is desired to improve the crosstalk phenomenon when the size of the optical module is become smaller and smaller.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the detailed description and the accompanying drawings, in which.

DETAILED DESCRIPTION OF THE EXEMPLARY EMBODIMENTS

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Figure 2:
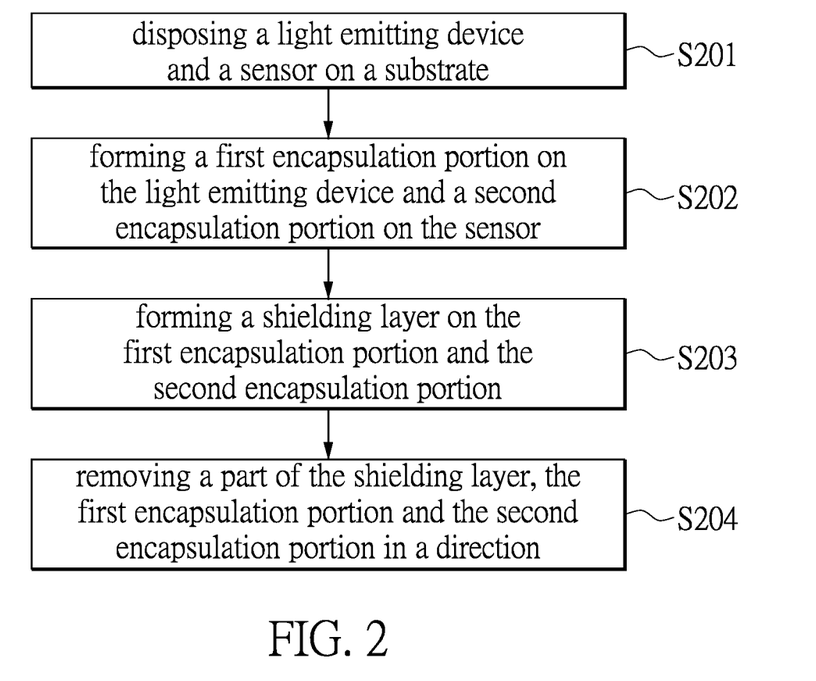
FIG. 2 is a flow chart of a manufacturing method of an optical module in a first embodiment of the present disclosure.
Figure 3A:
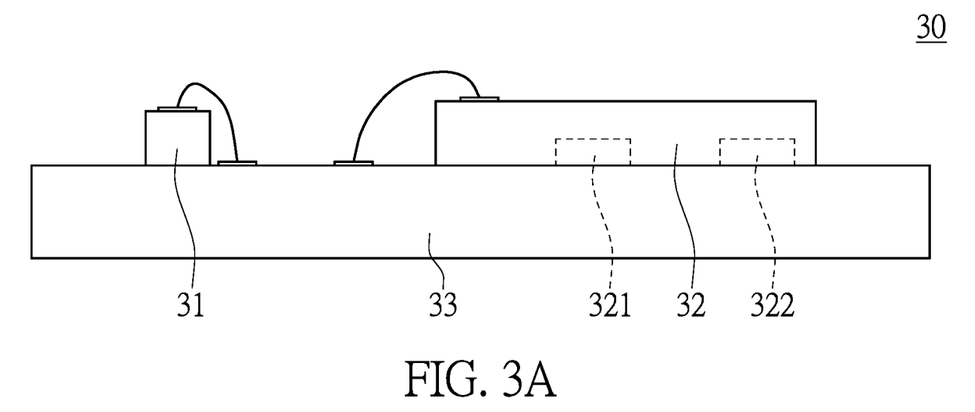
FIG. 3A to FIG. 3E are schematic views of the manufacturing method of the optical module.

FIG. 2 is a flow chart of a manufacturing method of an optical module in a first embodiment of the present disclosure. FIG. 3A to FIG. 3E are schematic views of the manufacturing process for the optical module in the first embodiment of the present disclosure. As shown in FIG. 2 and FIG. 3A, in step S201, in the manufacturing method of the optical module 30, a light emitting device 31 and a sensor 32 are firstly disposed on a substrate 33. The manner to dispose the light emitting device 31 and the sensor 32 on the substrate 33 can be die-attaching or wire-boding, but it is not limited thereto.

The light emitting device 31 can be an infrared light emitting diode (IR LED) or a laser diode to emit light in a specific wavelength. The sensor 32 can be a photodiode or any other sensors capable of detecting light emitted from the light emitting device 31. Specifically, in the embodiment of the present disclosure, the sensor 32 is able to detect the infrared light emitted from the light emitting device 31. The sensor 32 in the embodiment of the present disclosure may include an ambient light sensor 321 and a proximity sensor 322, but it is not limited thereto. The sensor 32 can detect an object or an obstacle in front of the sensor 32 by an optical manner. Specifically, the sensor 32 can detect the light, which is emitted by the light emitting device 33, reflected from the object or the obstacle and the sensor 32 will determine whether the object or the obstacle is close enough to the sensor 32 via the reflected light. Accordingly, the optical module 30 in the present disclosure can be used in a mobile phone to determine whether someone is close to the mobile phone or used in a robot vacuum or cleaner to detect whether a furniture or someone blocking a sweeping path. The substrate 33 in the present disclosure is preferred to be a print circuit board (PCB), but it is not limited thereto. In a different embodiment, a wire bonding process may be used to electrically connect the light emitting device 31 and the sensor 32 to the conductive components (not shown) on the substrate 33.

Figure 3B:
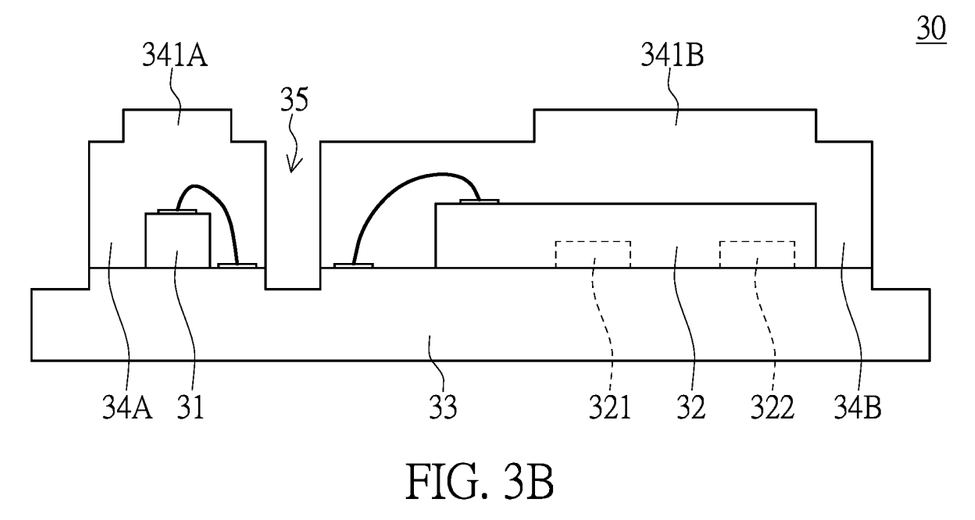

With reference to FIG. 3B, in step S202, a first encapsulation portion 34A and the second encapsulation portion 34B are respectively formed on the light emitting device 31 the sensor 32 by a molding process. Specifically, the first encapsulation portion 34A and the second encapsulation portion 34B are molded and disposed over the light emitting device 31 and the sensor 32 respectively to avoid electrical contact among the light emitting device 31, the sensor 32 and any electrical components on the substrate 33. In addition, the molding compound used to form the first encapsulation portion 34A and the second encapsulation portion 34B are preferred to be a transparent material, e.g., epoxy compound, silicone or urea resin, but it is not limited thereto. Furthermore, both of the first encapsulation portion 34A and the second encapsulation portion 34B can be formed at the same time or in two different steps, and it is not limited thereto. The first encapsulation portion 34A and the second encapsulation portion 34B include proper height and thick to protect the light emitting device 31, the sensor 32 or the wire bonding during manufacturing the optical module 30 in the present disclosure. In addition, the molding process in step S202 will form a gap 35 between the light emitting device 31 and the sensor 32, and the gap 35 is used to facilitate metal coating in the following process or step to form a barrier so as to separate the light emitting device 31 from the sensor 32 for reducing interference and crosstalk between the light emitting device 31 and the sensor 32, as shown in FIG. 3B.

Moreover, a first protrusion 341A and a second protrusion 341B are respectively formed on the first encapsulation portion 34A and the second encapsulation portion 34B. The first protrusion 341A and the second protrusion 341B are formed as reference locations for the following cutting process or step to produce open windows on top of the first encapsulation portion 34A and the second encapsulation portion 34B. On the other hand, in a different embodiment, an encapsulation material, e.g., resin and so on, may be firstly formed or molded on the light emitting device 31, the sensor 32 and the substrate 33, and then some parts of the encapsulation material located at the peripheral of the light emitting device 31 and the sensor 32 are removed or cut so as to form a gap 35, the first encapsulation portion 34A and the second encapsulation portion 34B, but it is not limited thereto. The area of the first protrusion 341A and the area of the second protrusion 341B may be respectively the same of or less than the first encapsulation 34A and the second encapsulation 34B thereof, and it is not limited thereto.

Figure 3C:
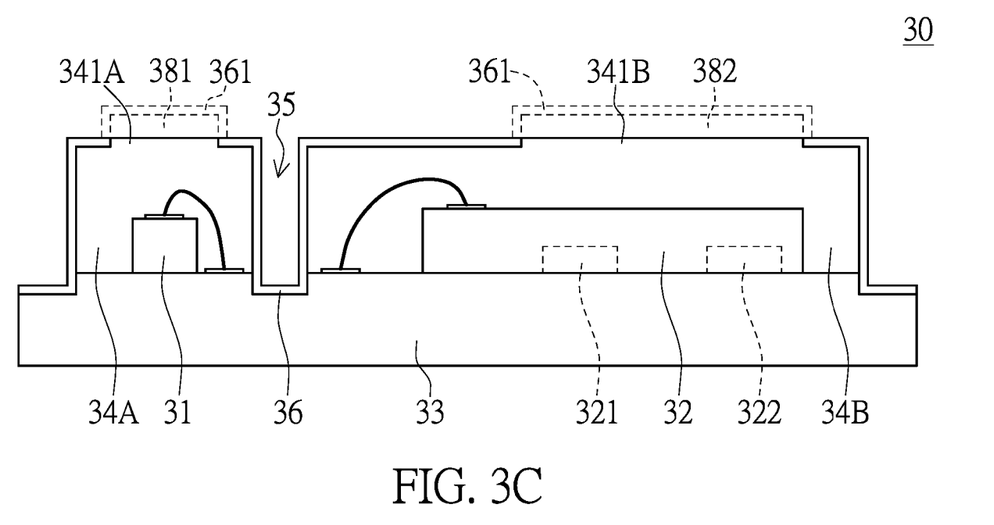

With reference to FIG. 3C, in step S203, a shielding layer 36 is formed on the first encapsulation portion 34A and the second encapsulation portion 34B so as to form a continued profile on the first encapsulation portion 34A and the second encapsulation portion 34B. For example, the continued profile of the shielding layer 36 can be formed in accordance with the profile defined by the exposed surface of substrate, the first encapsulation 34A, and the second encapsulation 34B. Specifically, an electro-less plating process is preferred to be used to form the shielding layer 36 on the first encapsulation portion 34A and the second encapsulation portion 34B, but it is not limited thereto. The electro-less plating process in the present disclosure may implement a dry film as a material and then a lamination process, an exposure process or other mechanical design to dispose the shielding layer 36 on the first encapsulation portion 34A and the second encapsulation portion 34B. In addition, the continued profile of the shielding layer 36 is formed in accordance with the shapes of the first protrusion 341A of the first encapsulation 34A and the second protrusion 341B of the second encapsulation 34B.

The shielding layer 36 will cut off more than 90% infrared ray (IR) intensity to form a shield to prevent from light penetration from the light emitting device 31 to the sensor 32 and reduce crosstalk phenomenon between the light emitting device 31 and the sensor 32 so as to improve the performance of the optical module 30. The material of the shielding layer 36 can be, for example, copper (Cu), gold (Au), silver (Ag) or a combination thereof, but it is not limited thereto. By the electro-less plating process, the shielding layer 36 can be sub-micron thick to achieve the purpose of the minimization of the optical module 30.

With reference to FIG. 3C, in step S204, a part of the shielding layer 36, the first encapsulation portion 34A and the second encapsulation portion 34B in a direction, so as to expose the first encapsulation portion 341A and the second encapsulation portion 341B from the shielding layer 36. Specifically, a cutting process is performed to remove a first portion 381 of the first encapsulation portion 34A, a second portion 382 of the second encapsulation portion 34B and a third portion 361 of the shielding layer 36. The first portion 381 corresponds to a position of the light emitting diode 31, the second portion 382 corresponds to a position of the sensor 32 and the third portion 361 of the shielding layer 36 corresponds to the light emitting device 31 and the sensor 32.

In addition, the first portion 381 of the first encapsulation portion 34A is the first protrusion 341A of the first encapsulation portion 34A and the second portion 382 of the second encapsulation portion 34B is the second protrusion 341B of the second encapsulation portion 34B. The third portion 361 includes a section of the shielding layer 36. The third portion 361 of the shielding layer 36 on top of the first encapsulation portion 34A and the second encapsulation portion 34B and corresponding to the first light emitting device 31 and the sensor 32 respectively will block at least one optical transmitting path on top of the light emitting device 31 or the sensor 32 so that the first portion 381, the second portion 382 and the third portion 361 are removed by the cutting process in the current embodiment, and the first portion 381, the second portion 382 and the third portion 361 are removed to open a window above the light emitting device 31 and a window above the sensor 32. Since the first protrusion 341A and the second protrusion 341B were formed in step S202, the cutting process is able to remove the first portion 381, the second portion 382 and the third portion 361 easily.

In order to acquire a better sensing capability, the first portion 381, the second portion 382 and the third portion 361 are removed, and a first window 383 and a second window 384 are respectively formed on the first encapsulation portion 34A and the second encapsulation portion 34B. The first window 383 and the second window 384 are formed to expose a first top exposed surface 342A of the first encapsulation portion 34A and a second top exposed surface 342B of the second encapsulation portion 34B, and the first window 383 and the second window 384 are respectively corresponding to the light emitting device 31 and the sensor 32. In other words, two top surfaces of the shielding layer 36 are formed and respectively look the same as the first top exposed surface 342A and the second top exposed surface 342B.

Therefore, the first window 383 and the second window 384 limit the light transmitting path so as to include best functional aspects of the sensor 32 and increase reliability by preventing the light from the light emitting device 31 being scattered into the sensor 32.

Specifically, the light emitted from the light emitting device 31 may be scattered to the sensor 32, and the detecting capability of the sensor 32 will be affected. In the embodiment of the present disclosure, the shielding layer 36 may block some or all of the scattered light emitted from the light emitting device 31, but the shielding layer 36 may also block the detecting light, which is reflected from a detecting object, at the same time. Therefore, the cutting process is required to remove the first portion 381 and the second portion 382 on top of the first encapsulation portion 34A and the second encapsulation portion 34B and provide the first window 383 and the second window 384 so as to prevent from blocking the light emitted from the light emitting device 31 or transmitted to the sensor 32.

Figure 3D:
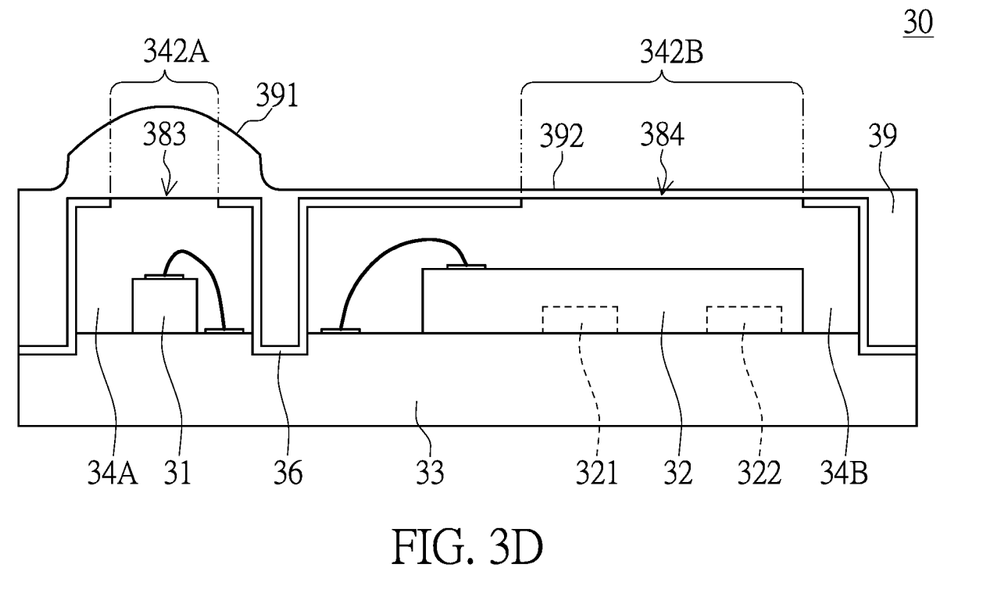

With reference to FIG. 3D, a third encapsulation portion 39 is formed on the shielding layer 36, the first encapsulation portion 34A and the second encapsulation portion 34B. The third encapsulation portion 39 is used to protect the shielding layer 36, the first window 383 and the second window 384. Specifically, the third encapsulation portion 39 includes a surface having a first section 391 and a second section 392. The first section 391 of the third encapsulation portion 39 is formed on the first window 383, and the second section 392 of the third encapsulation portion 39 is formed on the second window 384. In the preferred embodiment, the thickness of the second section 392 is less than 3-5 μm, so the light emitted directly form light emitting device 31 will not be transmitted within in the third encapsulation portion 39. In other words, in the embodiment of the present disclosure, the thickness of the second section 392 is thin enough and is not capable of affecting the light being transmitted to the sensor 32. The first section 391 may be connected to the second section 392, but, in a different embodiment, the first section 391 may be close to the second section 392 and will not be directly connected to the second section 392, and it is not limited thereto.

The first section 391 may include a dome surface, and an optical lens with a dome shape is formed on top exposed surface of the first encapsulation portion 34A over the light emitting device 31 by the third encapsulation portion 39 to upgrade LED axial luminance intensity and provide better illumination performance. However, in a different embodiment of the present disclosure, the first section 391 may include an aspheric surface, a cambered surface, a parabolic surface, a hyperbolic surface and etc. to enhance the illumination strength of the light emitting device 31, but it is not limited thereto.

Figure 3E:
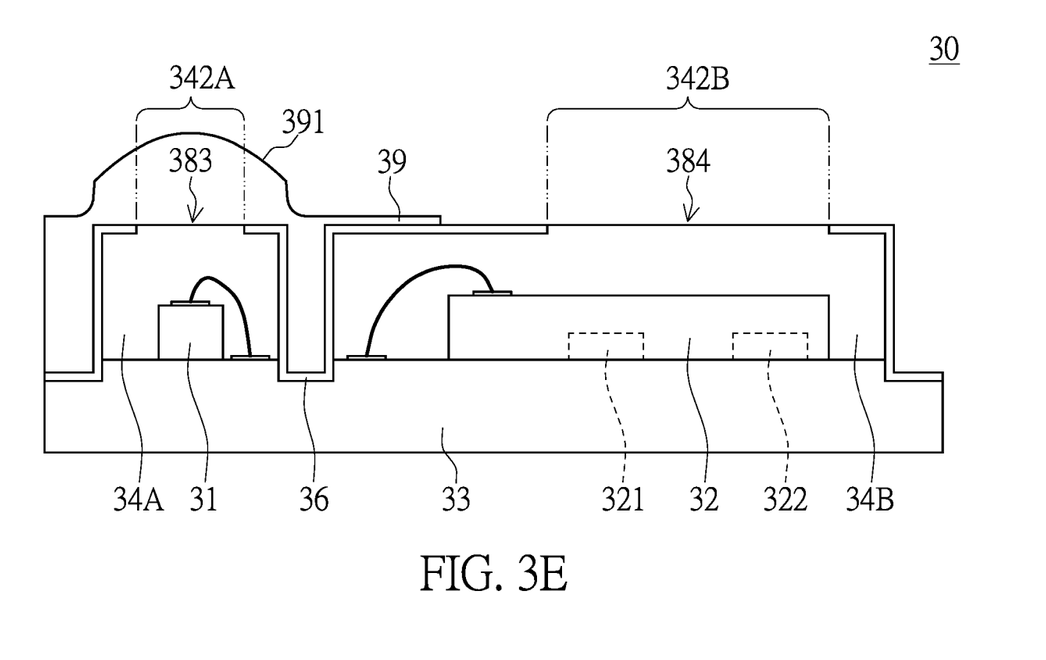

FIG. 3E is a schematic view of the optical module with a different shape of the third encapsulation portion 39 in a different embodiment of the present disclosure, wherein the third encapsulation portion 39 is only formed as an optical lens on top of the light emitting device 31. Specifically, the third encapsulation portion 39 may include the dome surface only without forming the second section 392 of the third encapsulation portion 39 on the second encapsulation portion 34B and a part of the shielding layer 36 so as to expose the second window 384 of the second encapsulation portion 34B. The reason to expose the second window 384 from the third encapsulation portion 39 is to minimize the crosstalk affect in the optical module 10 of the present disclosure. In other word, the first section of the third encapsulation portion 39 having the dome surface is located on top of the first encapsulation portion 54A to enhance the illumination of the light emitting device 31.

After the third encapsulation portion 39 is formed on the shielding layer 36, the first window 383 and the second window 384, the manufacturing method of the optical module 30 is completed. By the aforementioned manufacturing method with the restricted size package in the optical module, the problem of the crosstalk phenomenon could be minimized.

Figure 4:
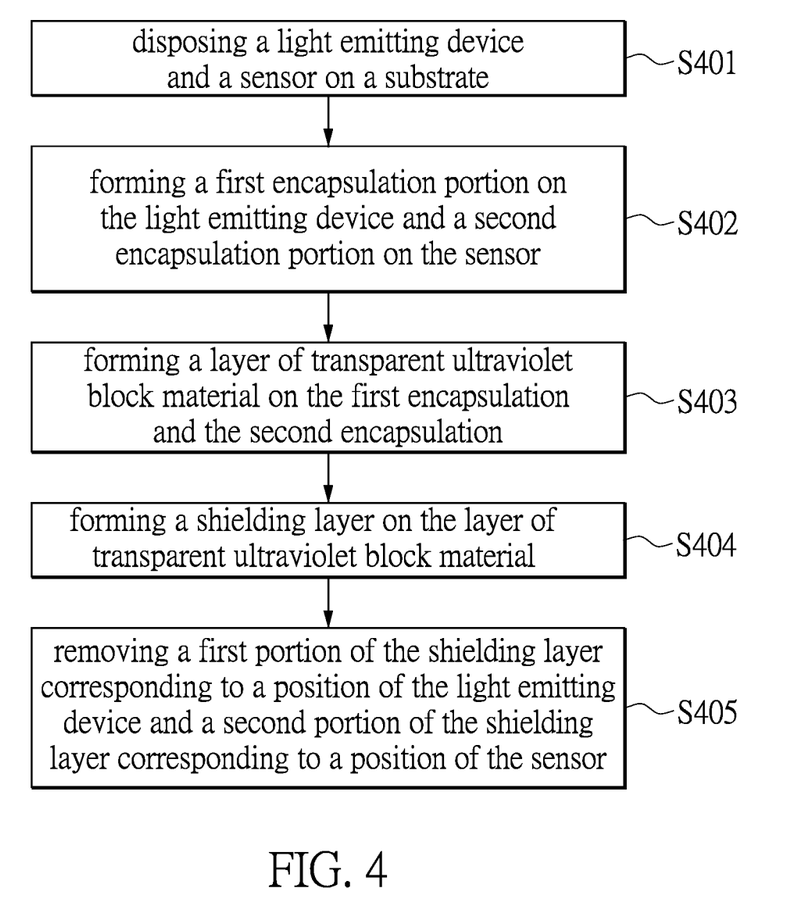
FIG. 4 is a flow chart of a manufacturing method of an optical module in a second embodiment of the present disclosure.
Figure 5A:
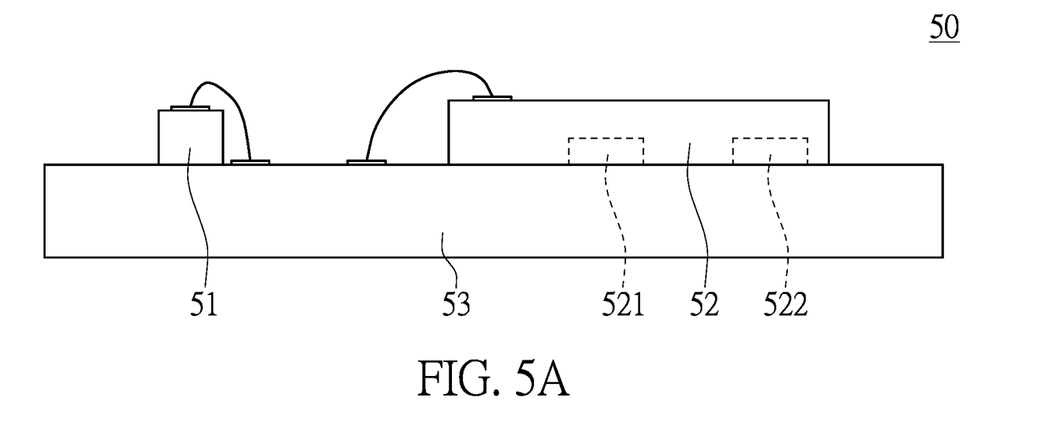
FIG. 5A to FIG. 5G are schematic views of the manufacturing method of the optical module.

FIG. 4 is a flow chart of a manufacturing method of an optical module in a second embodiment of the present disclosure. FIG. 5A to FIG. 5G are schematic views of the manufacturing process for the optical module in the second embodiment of the present disclosure. As shown in FIG. 4 and FIG. 5A, in step S401, in the manufacturing method of the optical module 50, a light emitting device 51 and a sensor 52 are firstly disposed on a substrate 53. The manner to dispose the light emitting device 51 and the sensor 52 on the substrate 53 can be die-attaching or wire-boding, but it is not limited thereto.

Figure 5B:
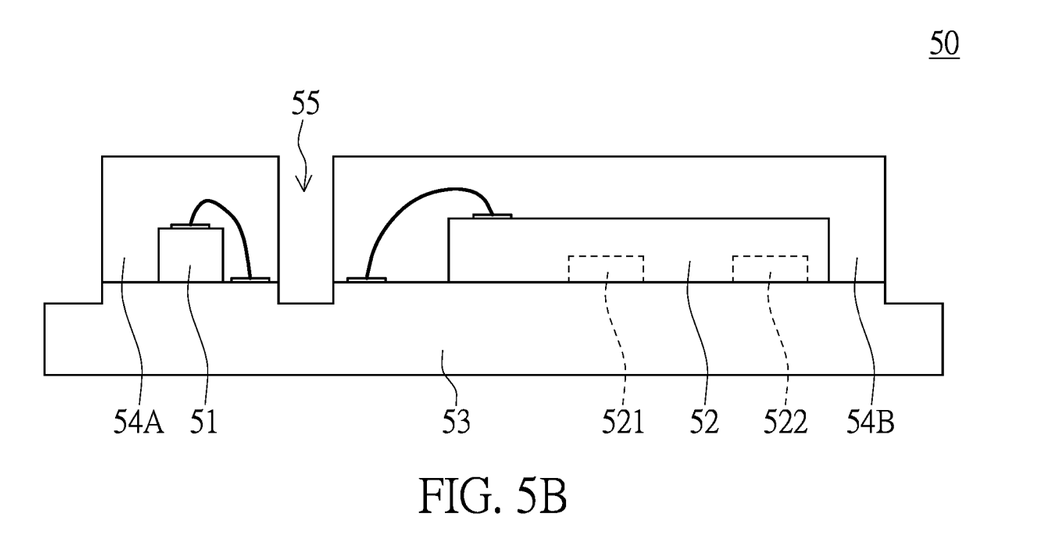

With reference to FIG. 5B, in step S402, a first encapsulation portion 54A and a second encapsulation portion 54B are respectively formed on the light emitting device 51 and the sensor 52 by a molding process. Specifically, the first encapsulation portion 54A and the second encapsulation 54B are respectively molded over the light emitting device 51 and the sensor 52 to avoid electrical contact among the light emitting device 51, the sensor 52 and any electrical components on the substrate 53. In addition, the molding compound used in the first encapsulation portion 54A and the second encapsulation portion 54B are preferred to be a transparent material, e.g., epoxy compound, silicone or urea resin, but it is not limited thereto. Furthermore, the first encapsulation portion 54A and the second encapsulation portion 54B include proper height and thick to protect the light emitting device 51, the sensor 52 or the wire bonding during manufacturing the optical module 50 in the present disclosure. In addition, the molding process in step S402 will form a gap 55 between the light emitting device 51 and the sensor 52, and the gap 55 is used to facilitate metal coating in the following process or step to form a barrier so as to separate the light emitting device 51 from the sensor 52 for reducing interference and crosstalk between the light emitting device 51 and the sensor 52, as shown in FIG. 5B.

Figure 5C:
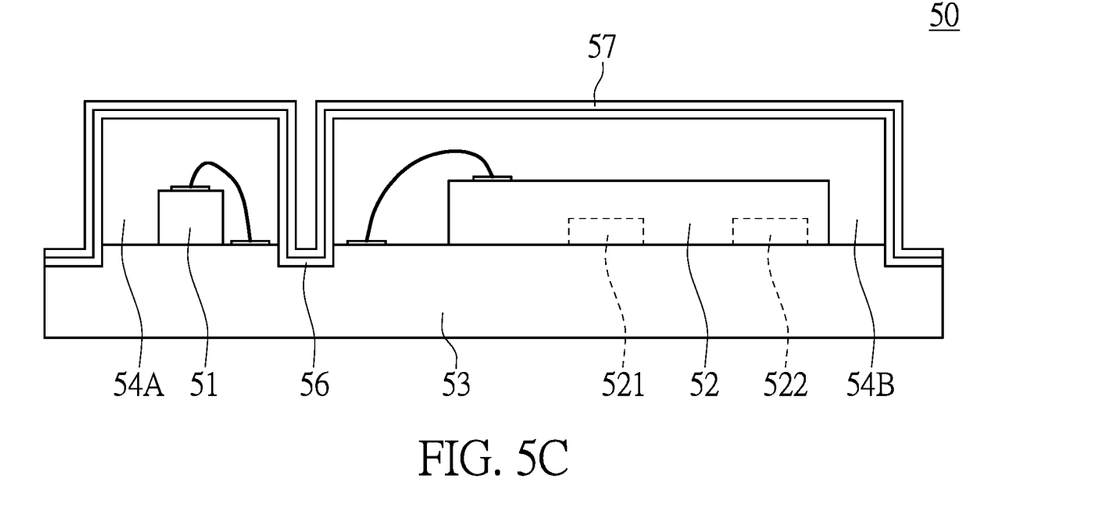

With reference to FIG. 5C, in step S403, an ultraviolet block layer 56 is formed on the first encapsulation portion 54A, the second encapsulation portion 54B and the substrate 53. Specifically, the ultraviolet block layer 56 is coated on the first encapsulation portion 54A, the second encapsulation portion 54B and the substrate 53 by means of spraying, dipping or painting, but it is not limited thereto. The ultraviolet block layer 56 is coated on the first encapsulation portion 54A and the second encapsulation portion 54B to provide a requirement for optical shielding. The reason for the optical shielding requirement is to block laser light used in the following step and the laser light would damage the performance of the light emitting device 51 or the sensor 52. The ultraviolet block layer 56 is able to protect the light emitting device 51 or the sensor 52 from the laser light. The ultraviolet block layer 56 can be any materials capable of providing optical shielding or IR blocking, but it is not limited thereto. In addition, after the step S403, a curing process may be implemented on the ultraviolet block layer 56 by an ultraviolet light in the embodiment of the present disclosure. The curing process is used to make sure that the ultraviolet block layer 56 is stuck well on the first encapsulation portion 54A and the second encapsulation portion 54B, and the curing process includes at least one of ultraviolet light curing process and at least one heating process, but it is not limited thereto.

Still reference to FIG. 5C, in step S404, a shielding layer 57 is formed on the ultraviolet block layer 56. Specifically, the shielding layer 57 is formed and disposed on the ultraviolet block layer 56 by an electro-less plating process. The electro-less plating process in the present disclosure may implement a dry film as a material and then a lamination process, an exposure process or other mechanical design is used to dispose the shielding layer 57 on the ultraviolet block layer 56. The shielding layer 57 will cut off more than 90% infrared ray (IR) intensity to form a shield preventing from light penetration from the light emitting device 51 to the sensor 52 and reduce crosstalk phenomenon between the light emitting device 51 and the sensor 52 so as to improve the performance of the optical module 50. The material of the shielding layer 57 can be, for example, copper (Cu), gold (Au), silver (Ag) or a combination thereof, but it is not limited thereto. By the electro-less plating process, the shielding layer 57 can be sub-micron thick to achieve the purpose of the minimization of the optical module 50.

Figure 5D:
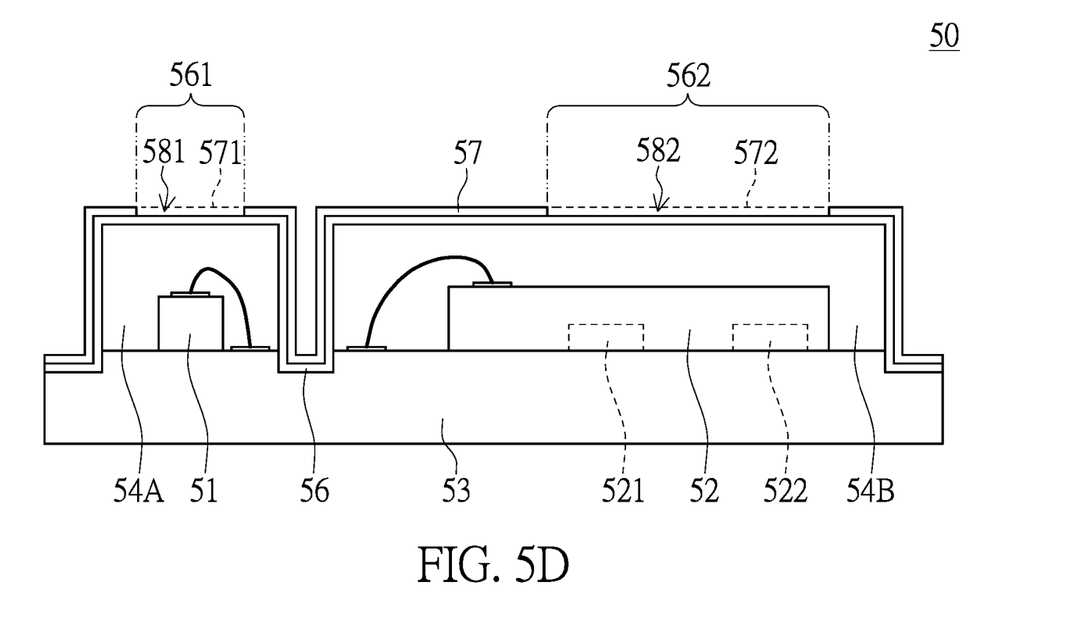

With reference to FIG. 5D, in step S405, an etching process is performed to remove a first portion 571 and a second portion 572 of the shielding layer 57 respectively, and the first portion 571 of the shielding layer 57 is corresponding to a position of the light emitting device 51 and the second portion 572 of the shielding layer 57 is corresponding to a position of the sensor 52. The first portion 571 and the second portion 572 are a section of the shielding layer 57 and will block at least one optical transmitting path on top of the light emitting diode 51 or the sensor 52 so that the first portion 571 and the second portion 572 are removed to open a window above the light emitting device 51 and a window above the sensor 52. In order to remove the first portion 571 and the second portion 572 precisely, an UV laser etching process in the present disclosure is preferred to be used, but it is not limited thereto. Because of the ultraviolet block layer 56, the light emitting device 51 and the sensor 52 will not be damaged in the UV laser etching process.

Figure 5E:
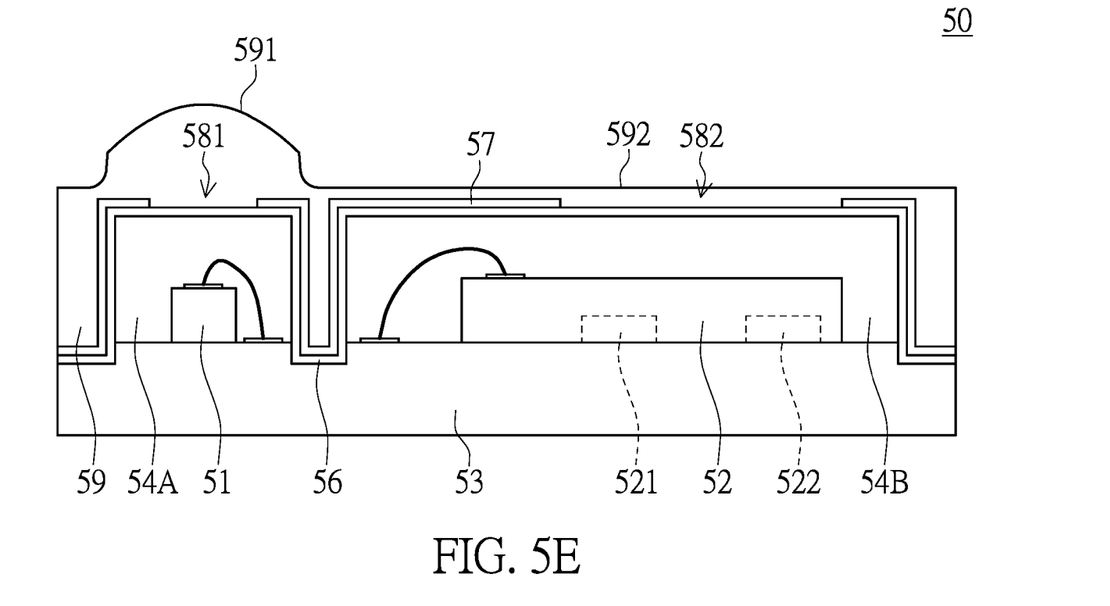
Figure 5F:
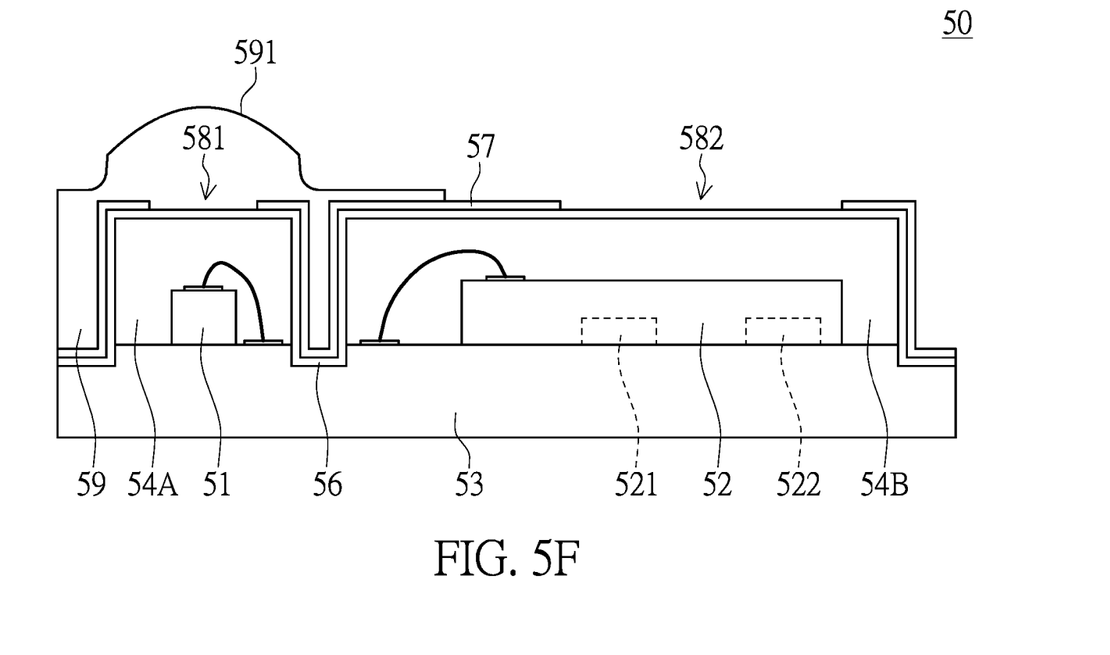

In order to acquire a better sensing capability, the first portion 571 and the second portion 572 of the shielding layer 57 are removed, and a first window 581 and a second window 582 are formed on top of the ultraviolet block layer 56, as shown in FIGS. 5E & 5F. The first window 581 and the second window 582 are formed to expose a third portion 561 and a fourth portion 562 of the ultraviolet block layer 56, and the first window 581 and the second window 582 are respectively corresponding to the light emitting device 51 and the sensor 52. Therefore, the first window 581 and the second window 582 limit the light transmitting path so as to include best functional aspects of the sensor 52 and increase reliability by preventing the light emitted from the light emitting device 51 or transmitted to the sensor 52 from being blocked by the shielding layer 57. The etching process is not able to go beyond the shielding layer 57 and reaches UV block coating underneath the shielding layer 57. Hence, the light emitting device 51 and the sensor 52 below the ultraviolet block layer 56 and inside the first encapsulation portion 54A and the second encapsulation portion 54B are protected from the UV laser.

Then, the etching process is required to remove the first portion 571 and the second portion 572 of the shielding layer 57 so as to form the first window 581 and the second window 582 to prevent the light emitted from the light emitting diode 51 or transmitted to the sensor 52 from being blocked. Because of the ultraviolet block layer 56, the first encapsulation portion 54A and the second encapsulation portion 54B, the light emitting device 51 and the sensor 52 will not be affected by the laser etching process.

The difference between the first embodiment and the second embodiment is that the laser etching process in the second embodiment is more precise than the cutting process in the first embodiment, and the etching process is capable of removing a small area of the first portion 571 and the portion 572.

With reference to FIG. 5E, in step S406, a third encapsulation portion 59 is formed on the shielding layer 57 and the ultraviolet block layer 56 by a molding process. The third encapsulation portion 59 is formed by the molding process and used to protect the shielding layer 57 and the ultraviolet block layer 56. Specifically, the third encapsulation portion 59 includes a first section 591 and a second section 592 connected to the first section 591. The first section 591 of the third encapsulation portion 59 is located on the first window 581, and the second section 592 of the third encapsulation portion 59 is located on the second window 582, wherein the thickness of the second section 592 is less than 5 μm, so the light emitted directly form light emitting device 51 will not capable transmitted to the sensor 32 via the connection between the first section 591 and a second section 592 of the third encapsulation portion 59. The first section 591 may include a dome surface, so that a dome lens is formed on top of the light emitting device 51 to upgrade LED axial luminance intensity and provide better illumination performance. However, in a different embodiment of the present disclosure, the first section 591 may be an aspheric surface, a cambered surface, a parabolic surface, a hyperbolic surface and etc. to enhance the illumination strength of the light emitting device 51, but it is not limited thereto.

In a different embodiment, the third encapsulation portion 59 is formed as shown in FIG. 5F. The third encapsulation portion 59 in the different embodiment of the present disclosure may only include the first section 591 without the second section 592 covering the second window 582. In other words, the third encapsulation portion 59 is formed with a continuous profile and covers the first window 581 of the ultraviolet block layer 56, and a portion of the shielding layer 57, which is close to the first encapsulation portion 54A. The first section 591 in the different embodiment of the present disclosure may also include a dome surface, an aspheric surface, a cambered surface, a parabolic surface, a hyperbolic surface and etc. to enhance the illumination strength of the light emitting device 51, but it is not limited thereto.

After the third encapsulation portion 59 is formed on the shielding layer 57 and the ultraviolet block layer 56, the manufacturing method of the optical module 50 is completed.

Figure 5G:
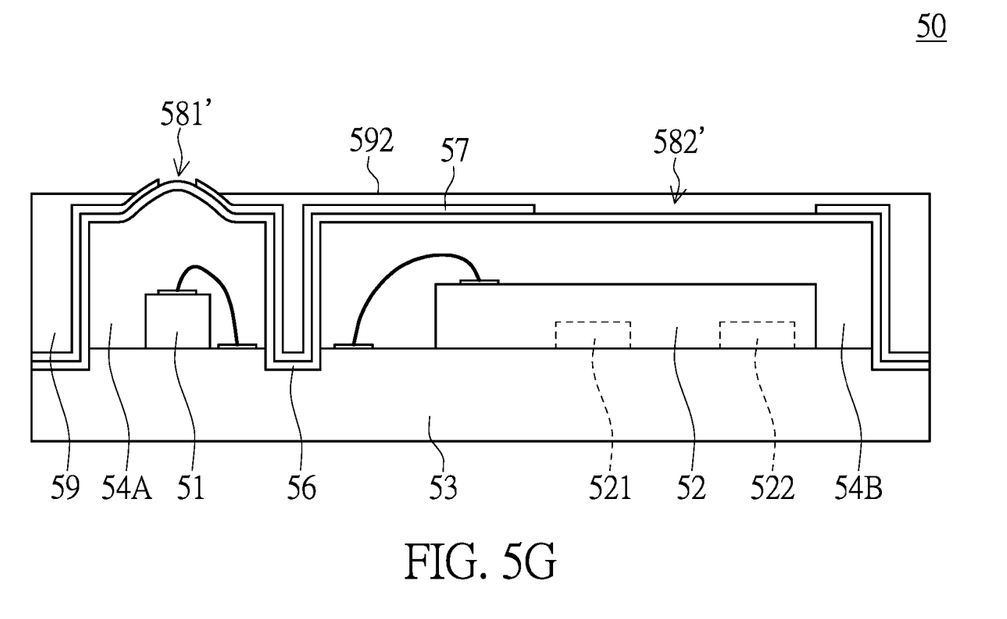

Alternatively, in a different embodiment shown in FIG. 5G, the first encapsulation portion 54A may be formed with a dome surface and then the ultraviolet block layer 56 and the shielding layer 57 will be disposed on the first encapsulation portion 54A, the second encapsulation portion 54B and the substrate 53 sequentially in accordance with the shape of the first encapsulation portion 54A and the shape of the second encapsulation layer 54B. Then, the ultraviolet block layer 56 and the shielding layer 57 are sequentially formed in accordance with the shape of the first encapsulation portion 54A and the shape of the second encapsulation portion 54B. Specifically, since the first encapsulation portion 54A is formed with the dome surface, the ultraviolet block layer 56 and the shielding layer 57 are also protruded at the position on top of the first encapsulation portion 45A. Since the second encapsulation portion 54B is formed with a horizontal surface, the ultraviolet block layer 56 and the shielding layer 57 are disposed at the position on top of the encapsulation portion 54B with the horizontal surface.

In the following step, the etching process is also implemented to remove the first portion 571 and the second portion 572 of the shielding layer 57 so as to form the first window 581' to expose the protruded portion of the ultraviolet block layer 56 above the first encapsulation portion 54A and the second window 582' to expose a portion of the ultraviolet block layer 56 above the second encapsulation portion 54B. At final, the third encapsulation portion 59 is formed without covering the first window 581 as shown in FIG. 5G.

In summary, since the shielding layer is formed on the first encapsulation portion by the electro-less plating manner to include a sub-micro thick, the optical module in the present disclosure is able to block most of the scattered light to include a better sensitivity performance. Moreover, because of the manufacturing process and the structure of the optical module in the present disclosure, the optical module is desired to improve the crosstalk phenomenon when the size of the optical module is become smaller and smaller.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A manufacturing method of an optical module, comprising:

disposing a light emitting device and a sensor on a substrate;

forming a first encapsulation portion on the light emitting device and a second encapsulation portion on the sensor;

forming an ultraviolet block layer on the first encapsulation portion and the second encapsulation portion;

forming a shielding layer on the ultraviolet block layer; and removing a first portion of the shielding layer corresponding to a position of the light emitting device and a second portion of the shielding layer corresponding to a position of the sensor so as to expose a part of the ultraviolet block layer on the first encapsulation portion corresponding to the position of the light emitting device and another part of the ultraviolet block layer on the second encapsulation portion corresponding to the position of the sensor, respectively.

2. The manufacturing method of the optical module according to claim 1 further comprising a step of: forming a third encapsulation portion on the shielding layer and the ultraviolet block layer.

3. The manufacturing method of the optical module according to claim 1, wherein the first portion and the second portion of the shielding layer are remoted removed by a laser etching process.

4. The manufacturing method of the optical module according to claim 1, wherein the first portion and the second portion of the shielding layer are removed to form a first window and a second window on the ultraviolet block layer, respectively.

5. The manufacturing method of the optical module according to claim 4 further comprising a step of: forming a third encapsulation portion on the first window of the ultraviolet block layer.

6. The manufacturing method of the optical module according to claim 5, wherein the third encapsulation portion includes a first section located on the first window of the ultraviolet block layer over the light emitting device, and the first section includes a dome surface.

7. The manufacturing method of the optical module according to claim 1, wherein the first encapsulation portion is formed with a dome surface, and the ultraviolet block layer and the shielding layer are sequentially protruded on top of the first encapsulation portion in accordance with the dome surface.

8. The manufacturing method of the optical module according to claim 1, further comprising curing the ultraviolet block layer by an ultraviolet light to stick the ultraviolet block layer well on the first encapsulation layer and the second encapsulation layer.

9. An optical module manufactured by the method of claim 1, wherein an optical lens is formed on top of the first encapsulation portion and corresponding to the light emitting device.

10. An optical module manufactured by the method of claim 1, wherein an optical lens is formed on a third portion of the ultraviolet block layer.

* * * * *